(12) United States Patent
Kohout et al.

(10) Patent No.: US 6,650,100 B1
(45) Date of Patent: Nov. 18, 2003

(54) BOOTSTRAP TECHNIQUE FOR A MULTIPLE MODE SWITCHING REGULATOR

(75) Inventors: James A. Kohout, Dallas, TX (US); David J. Baldwin, Allen, TX (US); Ross E. Teggatz, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/233,811

(22) Filed: Sep. 3, 2002

(51) Int. Cl.[7] .............................................. G05F 1/563
(52) U.S. Cl. ...................................................... 323/282
(58) Field of Search .................................. 323/282, 284, 323/351, 355, 223, 224

(56) References Cited

U.S. PATENT DOCUMENTS

| | | | | |
|---|---|---|---|---|
| 3,978,393 A | * | 8/1976 | Wisner et al. ............... | 323/272 |
| 4,403,269 A | * | 9/1983 | Carroll ....................... | 361/91.7 |
| 5,705,919 A | * | 1/1998 | Wilcox ........................ | 323/282 |
| 6,005,763 A | * | 12/1999 | North .......................... | 361/154 |
| 6,016,052 A | * | 1/2000 | Vaughn ....................... | 323/355 |
| 6,316,881 B1 | * | 11/2001 | Shannon et al. ............. | 315/219 |
| 6,369,559 B1 | * | 4/2002 | Ashrafzadeh ............... | 323/283 |
| 6,400,126 B1 | * | 6/2002 | Zuniga et al. .............. | 323/282 |
| 6,456,050 B1 | * | 9/2002 | Agiman ....................... | 323/282 |
| 6,522,113 B1 | * | 2/2003 | Betten ......................... | 323/282 |

\* cited by examiner

*Primary Examiner*—Adolf D. Berhane
(74) *Attorney, Agent, or Firm*—Alan K. Stewart; W. James Brady, III; Frederick J. Telecky, Jr.

(57) ABSTRACT

A multiple mode switching regulator with a bootstrap technique includes an inductor 20; a high side input switch 22 coupled to a first end of the inductor 20; a low side input switch 24 coupled to the first end of the inductor 20; a high side driver 34 coupled to a control node of the high side input switch 22; a low side driver 36 coupled to a control node of the low side input switch 24; a high side output switch 26 coupled to a second end of the inductor 20; a low side output switch 28 coupled to the second end of the inductor 20; a first bootstrap capacitor 30 coupled between the first end of the inductor 20 and a voltage supply node of the high side driver 34; a second bootstrap capacitor 32 coupled between the second end of the inductor 20 and a voltage supply node of the low side driver 36; and a first diode 40 coupled between the voltage supply node of the high side driver 34 and the voltage supply node of the low side driver 36. The two bootstrap capacitors 30 and 32 are employed on both sides of inductor 20 to provide gate voltage to high side input switch 22 through high side driver 34 in any mode of operation. This allows the regulator to work in three modes of operation without different external components or configurations depending on the mode.

13 Claims, 4 Drawing Sheets

BOOTSTRAP TECHNIQUE FOR A MULTIPLE MODE SWITCHING REGULATOR

FIELD OF THE INVENTION

This invention generally relates to electronic systems and in particular it relates to multiple mode switching regulators.

BACKGROUND OF THE INVENTION

A switching regulator provides a regulated output voltage to a load from an unregulated input voltage. A typical switching regulator has at least two switches that switch ON and OFF out of phase with each other to supply current to a load. Three types of switching regulators include: buck mode switching regulators, which regulate an output voltage that is lower than the input voltage; boost mode regulators, which regulate an output voltage that is higher than the input voltage; and buck-boost mode switching regulators, which regulate an output voltage that is higher, lower, or the same as the input voltage. These three modes can be combined to form a multiple mode switching regulator.

A typical multiple mode switching regulator includes an inductor with a first end coupled to both a first high side switch a first low side switch, and a second end coupled to both a second high side switch and a second low side switch. The first high side switch and first low side switch are on the input side. The second high side switch and second low side switch are on the output side. In buck mode, the first high side switch and first low side switch are switched ON and OFF out of phase with each other. In boost mode, the second high side switch and second low side switch are switched ON and OFF out of phase with each other. In buck-boost mode, the first high side switch and the second low side switch are switched ON and OFF in phase with each other, and the second high side switch and the first low side switch are switched ON and OFF in phase with each other, but out of phase with the first high side switch and second low side switch.

Prior art solutions typically do not work in all three modes of operation without external reconfiguration of the device. Typically, a device is configured to work in only one mode with a reduced input range, and thus does not require this type of solution.

One prior art solution adds another small boost regulator with an external inductor to be able to supply the required power. However, this adds an expensive external inductor, more circuitry, and possibly extra pins.

SUMMARY OF THE INVENTION

A multiple mode switching regulator with a bootstrap technique includes an inductor; a high side input switch coupled to a first end of the inductor; a low side input switch coupled to the first end of the inductor; a high side driver coupled to a control node of the high side input switch; a low side driver coupled to a control node of the low side input switch; a high side output switch coupled to a second end of the inductor; a low side output switch coupled to the second end of the inductor; a first bootstrap capacitor coupled between the first end of the inductor and a voltage supply node of the high side driver; a second bootstrap capacitor coupled between the second end of the inductor and a voltage supply node of the low side driver; and a first diode coupled between the voltage supply node of the high side driver and the voltage supply node of the low side driver. The two bootstrap capacitors and are employed on both sides of inductor to provide gate voltage to high side input switch through high side driver in any mode of operation. This allows the regulator to work in all three modes of operation without different external components or configurations depending on the mode.

DETAILED DESCRIPTION OF PREFERRED EMBODIMENTS

Figure 1:
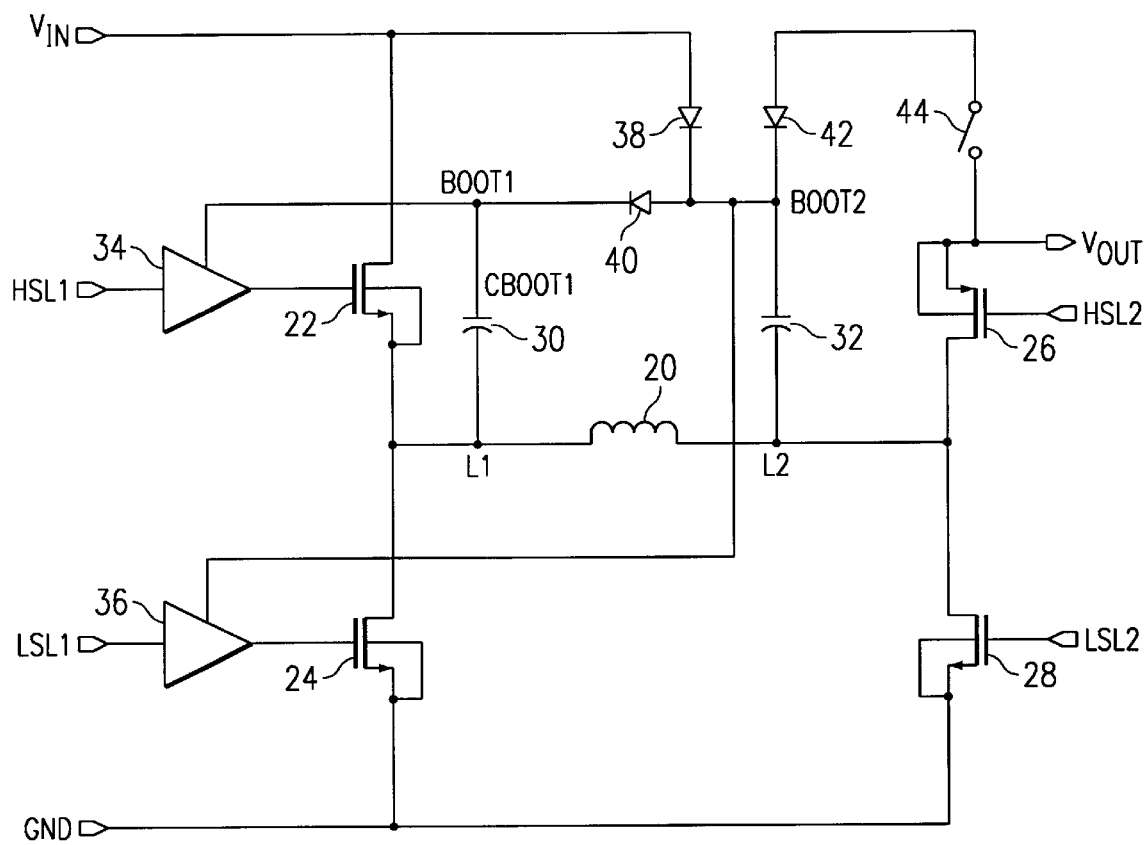
FIG. 1 is a schematic circuit diagram of a preferred embodiment multiple mode switching regulator with a bootstrap technique.

A preferred embodiment multiple mode switching regulator with a bootstrap technique is shown in FIG. 1. The circuit of FIG. 1 includes inductor 20; high side switch (NMOS transistor) 22; low side switch (NMOS transistor) 24; high side switch (PMOS transistor) 26; low side switch (NMOS transistor) 28; boot capacitors 30 and 32; drivers 34 and 36; diodes 38, 40, and 42; switch 44; input voltage Vin; output voltage Vout; switching signals HSL1, LSL1, HSL2, and LSL2; and ground GND.

Figure 2:
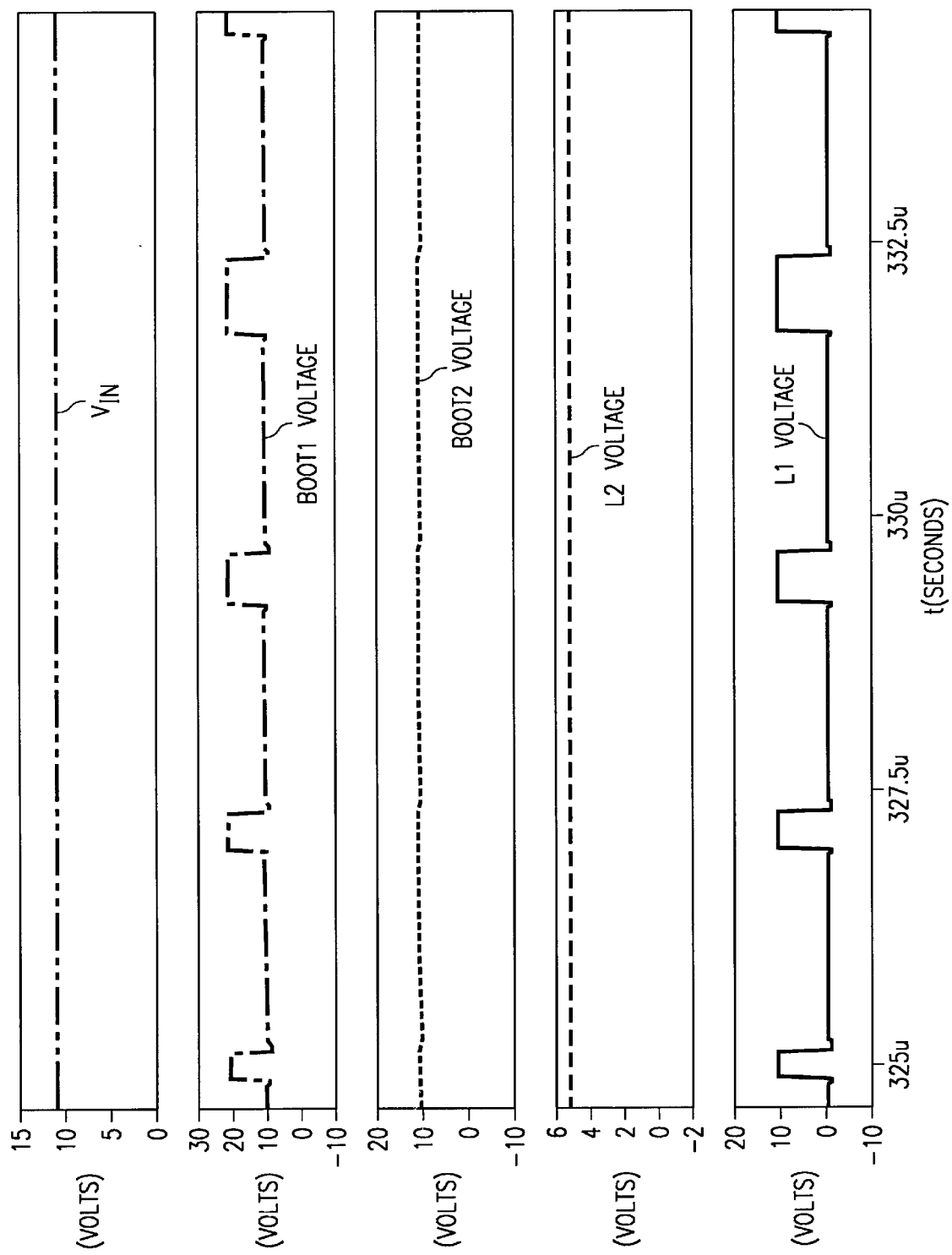
FIG. 2 is a plot of the general operation of the circuit of FIG. 1 in Buck mode.
Figure 3:
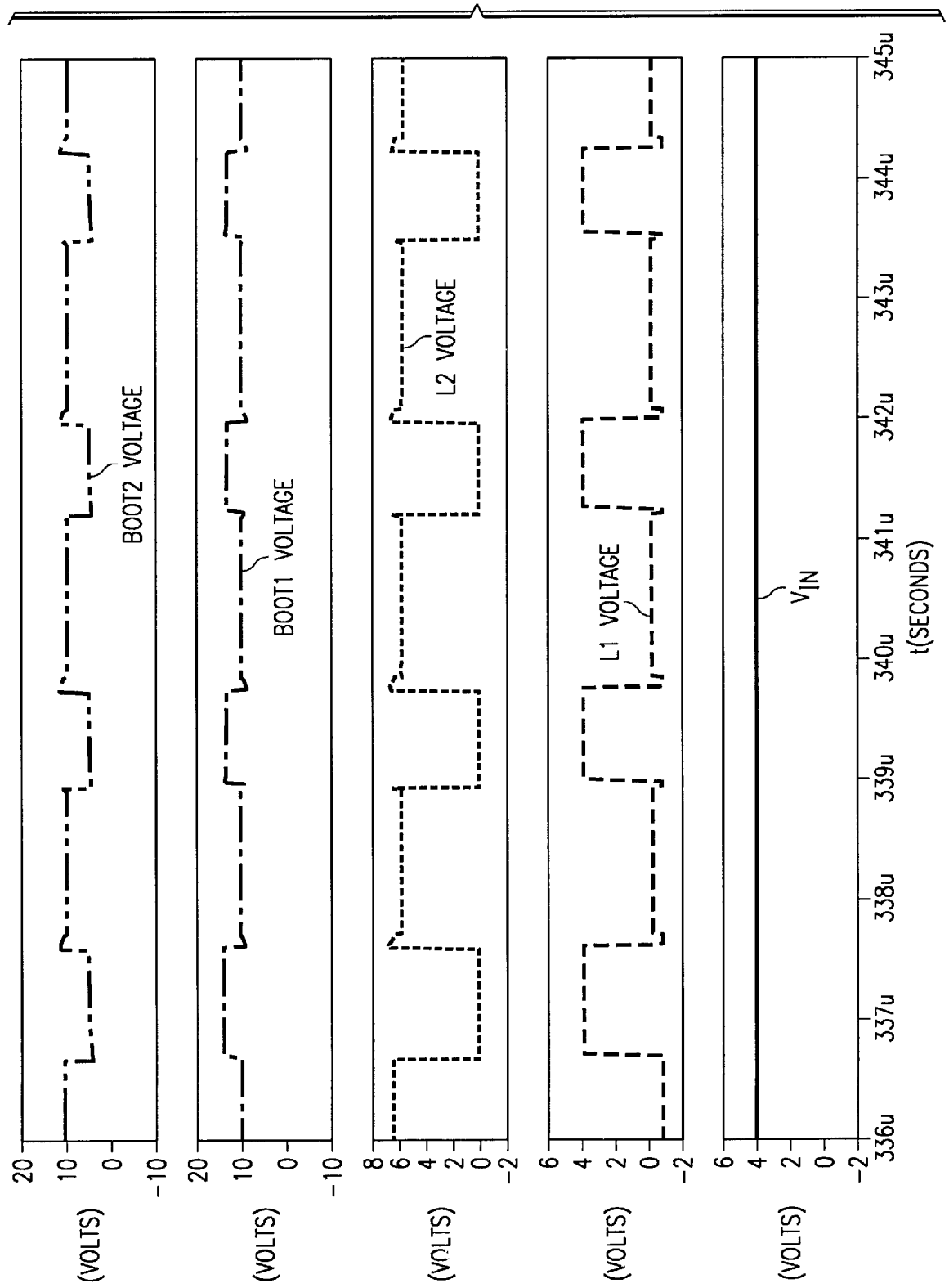
FIG. 3 is a plot of the general operation of the circuit of FIG. 1 in Buck-Boost mode.
Figure 4:
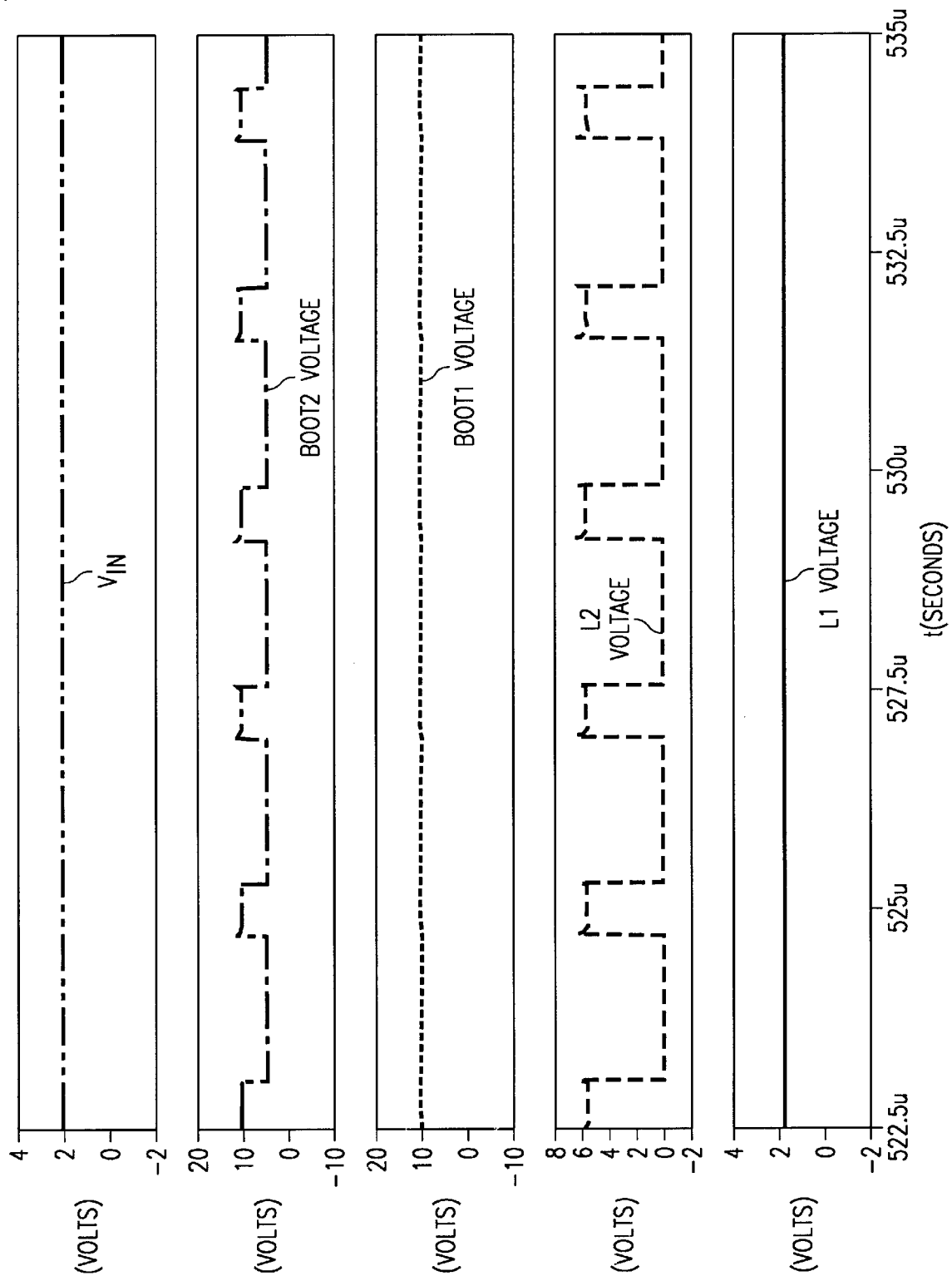
FIG. 4 is a plot of the general operation of the circuit of FIG. 1 in Boost mode.

Two bootstrap capacitors 30 and 32 are employed on both sides of inductor 20 to provide gate voltage to switch 22 through high side input driver 34 in any mode of operation. In Buck mode, a traditional bootstrap technique is used specifically on capacitor 30. An example of the general operation in Buck mode, with an input voltage Vin of 11 volts, is shown in FIG. 2. FIG. 2 is a plot of the input voltage Vin and the voltages at nodes L1, L2, Boot1, and Boot2 in Buck mode. In Buck-Boost mode, however, the switching of both the voltage at node L1 and the voltage at node L2 is utilized to provide extended gate voltages for switches 22 and 24. This is detailed more in FIG. 3 using an example input voltage Vin of 4 volts. FIG. 3 is a plot of the input voltage Vin and the voltages at nodes L1, L2, Boot1, and Boot2 in Buck-Boost mode. Finally, in Boost mode, shown in FIG. 4 with an input voltage Vin of 2 volts, the switching of the voltage at node L2 provides a bootstrap technique on capacitor 32 while capacitor 30 provides a "bucket" capacitor to keep the voltage at the gate of switch 22 high while it is not switching. FIG. 4 is a plot of the input voltage Vin and the voltages at nodes L1, L2, Boot1, and Boot2 in Boost mode.

The preferred embodiment solution of FIG. 1 allows the regulator to work in all three modes of operation, without different external components or configurations depending on the mode. A traditional bootstrap with a capacitor from node L1 to the gate of switch 22 does work for buck mode, however, would not work for boost mode when node L1 is not switching. Additionally, it adds a higher voltage for switch 22 and switch 24 in buck-boost mode. Finally, a charge pump could not supply the required voltage and current needed for the constant switching of switches 22 and 24 in buck and buck boost modes.

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description. It is therefore intended that the appended claims encompass any such modifications embodiments.

What is claimed is:

1. A circuit comprising:

an inductor;

a high side input switch coupled to a first end of the inductor;

a low side input switch coupled to the first end of the inductor;

a high side driver coupled to a control node of the high side input switch;

a low side driver coupled to a control node of the low side input switch;

a high side output switch coupled to a second end of the inductor;

a low side output switch coupled to the second end of the inductor;

a first bootstrap capacitor coupled between the first end of the inductor and a voltage supply node of the high side driver;

a second bootstrap capacitor coupled between the second end of the inductor and a voltage supply node of the low side driver; and a first diode coupled between the voltage supply node of the high side driver and the voltage supply node of the low side driver.

2. The circuit of claim 1 further comprising a second diode coupled between the second bootstrap capacitor and an input node.

3. The circuit of claim 1 wherein the high side input switch is coupled between the first end of the inductor and an input node.

4. The circuit of claim 2 wherein the high side input switch is coupled between the first end of the inductor and the input node.

5. The circuit of claim 1 wherein the high side output switch is coupled between the second end of the inductor and an output node.

6. The circuit of claim 5 further comprising a feedback switch coupled between the output node and the second bootstrap capacitor.

7. The circuit of claim 6 further comprising a diode coupled between the feedback switch and the second bootstrap capacitor.

8. The circuit of claim 1 wherein the low side input switch is coupled between the first end of the inductor and a common node.

9. The circuit of claim 8 wherein the low side output switch is coupled between the second end of the inductor and the common node.

10. The circuit of claim 1 wherein the high side input switch is a transistor.

11. The circuit of claim 1 wherein the low side input switch is a transistor.

12. The circuit of claim 1 wherein the high side output switch is a transistor.

13. The circuit of claim 1 wherein the low side output switch is a transistor.

* * * * *